(12) United States Patent
Mendenhall et al.

(10) Patent No.: US 11,579,118 B2
(45) Date of Patent: Feb. 14, 2023

(54) SINGLE POINT CONTACT TRIAXIAL SENSOR HEAD FOR AN INLINE INSPECTION TOOL

(71) Applicant: TDW Delaware, Inc., Wilmington, DE (US)

(72) Inventors: Todd R. Mendenhall, South Jordan, UT (US); Blake Owen, Alpine, UT (US); Ed Maynard, Holladay, UT (US)

(73) Assignee: TDW Delaware, Inc., Wilmington, DE (US)

( * ) Notice: Subject to any disclaimer, the term of this patent is extended or adjusted under 35 U.S.C. 154(b) by 445 days.

(21) Appl. No.: 16/890,809

(22) Filed: Jun. 2, 2020

(65) Prior Publication Data

US 2020/0378923 A1 Dec. 3, 2020

Related U.S. Application Data

(60) Provisional application No. 62/856,202, filed on Jun. 3, 2019.

(51) Int. Cl.
*G01N 27/83* (2006.01)
*G01R 33/02* (2006.01)
*G01N 27/87* (2006.01)

(52) U.S. Cl.
CPC ............. *G01N 27/83* (2013.01); *G01N 27/87* (2013.01); *G01R 33/02* (2013.01)

(58) Field of Classification Search
CPC ........ G01N 27/83; G01N 27/87; G01R 33/02; F16L 2101/30
See application file for complete search history.

(56) References Cited

U.S. PATENT DOCUMENTS

| 8,653,111 | B2 | 2/2014 | Simek et al. | |
|---|---|---|---|---|
| 2007/0022830 | A1* | 2/2007 | Mandziuk | G01N 27/902 73/865.8 |
| 2008/0258719 | A1* | 10/2008 | Putman | G01N 27/87 324/240 |
| 2011/0167914 | A1 | 7/2011 | Sutherland | |

(Continued)

FOREIGN PATENT DOCUMENTS

CN 108343802 A 7/2018

*Primary Examiner* — Alvaro E Fortich
(74) *Attorney, Agent, or Firm* — GableGotwals

(57) ABSTRACT

An inline inspection tool of this disclosure includes at least one sensor arm (50) having a sensor head (30) located at its distal end (51), the sensor head including an arched-shaped pipe contacting portion (33) between its forward and rearward ends (32, 34), the pipe contacting portion having a radius R and a width $W_C$; and at least one triaxial sensor element (31) having at least a portion located directly below the arched-shaped pipe contacting portion and having a width $W_S$, $W_C<W_S$. During the tool's travel through a pipeline, contact of the sensor head with the pipe wall lies along a single line of travel substantially equal to the width $W_C$. Because of its shape, the sensor head better traces and maintains contact with the pipe wall to detect dents, wrinkles, weld intrusions, and other defects or anomalies in the pipe wall.

14 Claims, 5 Drawing Sheets

(56) References Cited

U.S. PATENT DOCUMENTS

| | | |
|---|---|---|
| 2016/0245780 A1 | 8/2016 | Wayman et al. |
| 2018/0010934 A1* | 1/2018 | Pirner .................... F16L 55/00 |
| 2019/0086020 A1* | 3/2019 | Wehlin ................... B25J 5/007 |
| 2019/0086368 A1* | 3/2019 | Plichta .................. G01N 29/04 |

* cited by examiner

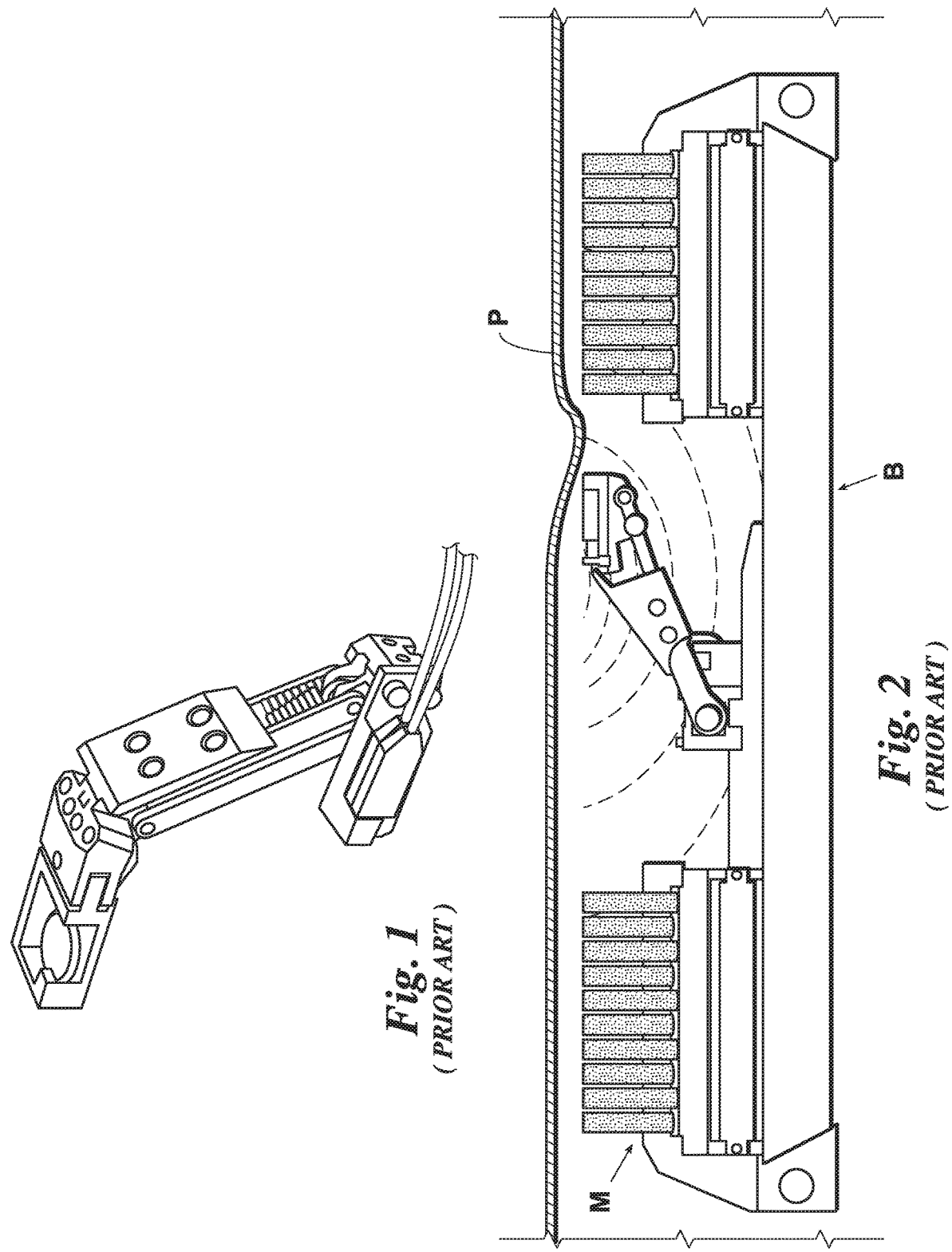

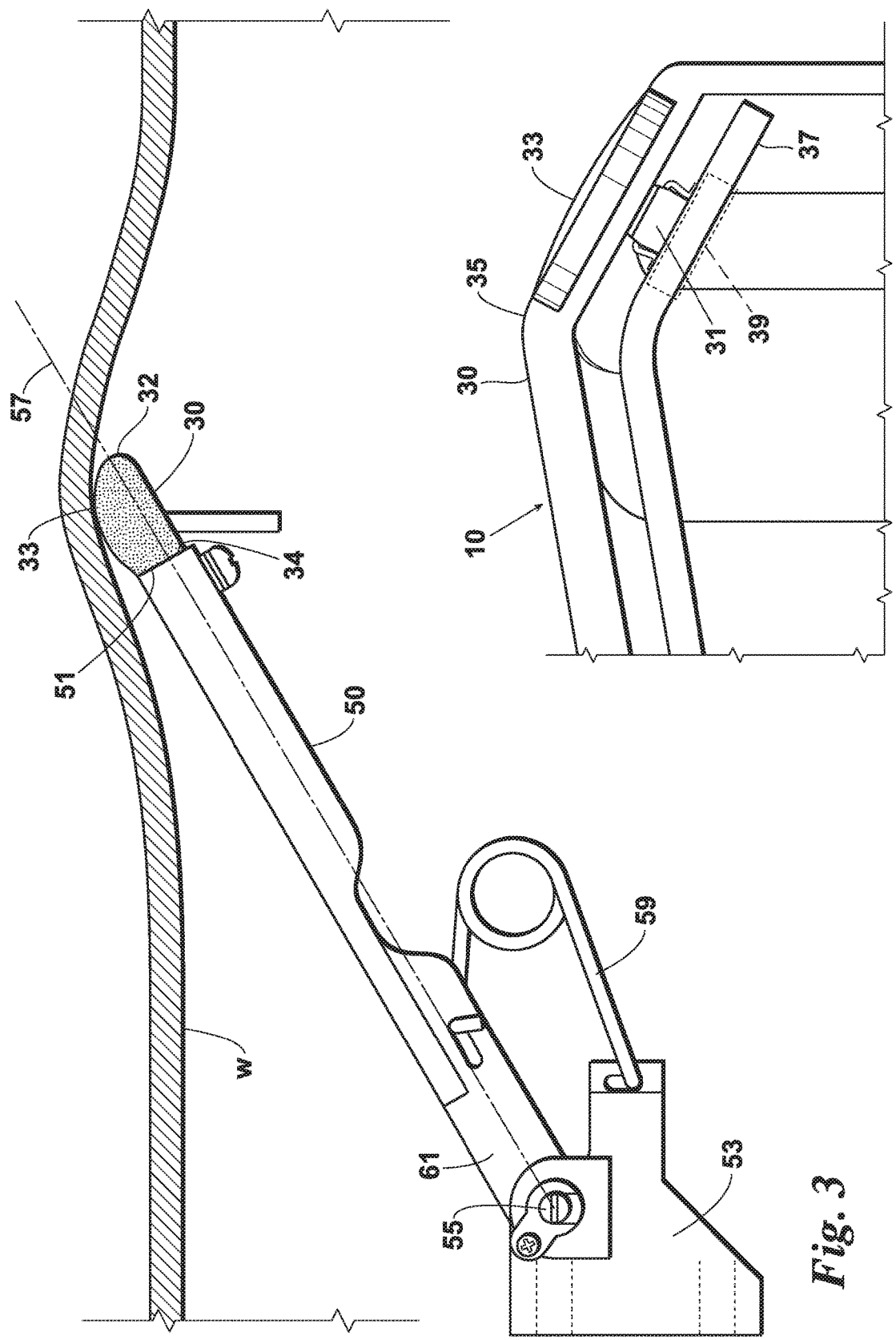

Figure # SINGLE POINT CONTACT TRIAXIAL SENSOR HEAD FOR AN INLINE INSPECTION TOOL

CROSS REFERENCE TO CO-PENDING APPLICATIONS

This application claims priority to U.S. Provisional Application 62/856,202 filed Jun. 13, 2019.

BACKGROUND

This disclosure is in the field of inline pipe inspection ("ILI") tools like those used to inspect oil and gas pipelines. More particularly, the disclosure relates to a triaxial sensor head of an ILI tool configured for use with flux leakage ILI technologies.

Inline pipe inspection tool customers are requiring improved identification and characterization of pipeline defects. In some cases, customers require multiple axis flux measurements as the implementation for accomplishing improved defect identification. This type of measurement can provide information that would be beneficial in defect identification.

In prior art ILI tools, multiple hall effect sensing axes has been achieved by using an array of single axis hall effect sensors. Single axis hall effect sensors have been available for decades and the tool platforms and data interpretation systems have been built around that technology. Use of an array of sensors has necessitated a rectangular or rectangular-shaped sensor head surface or contact face that contacts a comparatively large area of the pipe wall. See e.g. FIGS. 1 & 2.

Because of the large contact area, the rectangular head cannot track features such as dents and wrinkles in the pipe wall. Additionally, as the rectangular sensor head traverses weld intrusions, the head pulls away from the pipe wall until the entire length of the rectangular head clears the weld. The loss of inspection around these features of interest is not optimal.

Point contact arms have been used for deformation sensing, and there are point contact MFL arms that include uniaxial hall effect sensors. To date, no prior art ILI tool makes use of one or more triaxial hall effect sensors. in a head shape that tracks well along the pipe wall.

SUMMARY

Embodiments of an inline pipe inspection ("L") tool of this disclosure include an inspection sensor module having a head shape that includes one or more triaxial sensing elements and a curved or arched pipe contact surface of a predetermined radius that traverses the pipe such that each area and subsequent area of contact between it and the pipe wall lie along a single line of travel. The sensor module may be configured for use with any flux leakage inspection technology of a kind known in the art, for example axial magnetic flux leakage ("MFL"), spiral magnetic flux leakage ("SMFL"), low field magnetic flux leakage ("LFM"), and deformation ("DEF"). Magnetic flux leakage, typically utilized in all types of pipelines including those that transport liquid and gas, provides reliable detection and sizing of volumetric features. Collection of flux data in all three axes offers improved capability to characterization of pipeline features and defects. The historical tradeoff between pipe wall tracking and additional flux information is resolved through the incorporation of an inspection sensor module of this disclosure.

In embodiments, an inline inspection tool of this disclosure includes at least one sensor arm having a proximal end and a distal end, the proximal end configured for connection to a body of the inline inspection tool; and a sensor head located at the distal end of the at least one sensor arm, the sensor head the sensor head including a forward end and a rearward end and including an arched-shaped pipe contacting portion located between the forward and rearward ends and having a radius R and a width $W_C$; and at least one triaxial sensor element having at least a portion located directly below the arched-shaped pipe contacting portion and having a width $W_S$, $W_C < W_S$. In embodiments of a method of use, as the inline inspection tool passes through an interior of a pipe, contact of the sensor head with the pipe wall lies along a single line of travel substantially equal to the width $W_C$.

BRIEF DESCRIPTION OF THE DRAWINGS

FIG. 1 is a prior art rectangular sensor head with multiple-axis sensing using single axis hall effect sensors.

FIG. 2 is another prior art rectangular sensor head tracking arrangement. A backing bar is connected to the cylindrical-shaped tool body, with the magnet and brush arrangements and the sensor head arm connected to the backing bar. The sensor head arm, and therefore the sensor head, is located between adjacent magnets to detect perturbations in the magnetic field caused by dents, wrinkles, weld intrusions, and other defects or anomalies in the pipe wall.

FIG. 3 is an embodiment of a sensor head of this disclosure. The head includes a pipe contacting surface having an arcuate-, curved-, rounded-, or elliptical-shaped profile, at least in the Y-Z plane (using right-handed coordinates).

FIG. 4 is an embodiment illustrating triaxial sensor element placement relative to the pipe contacting surface of FIG. 3.

DETAILED DESCRIPTION

Figure 5:
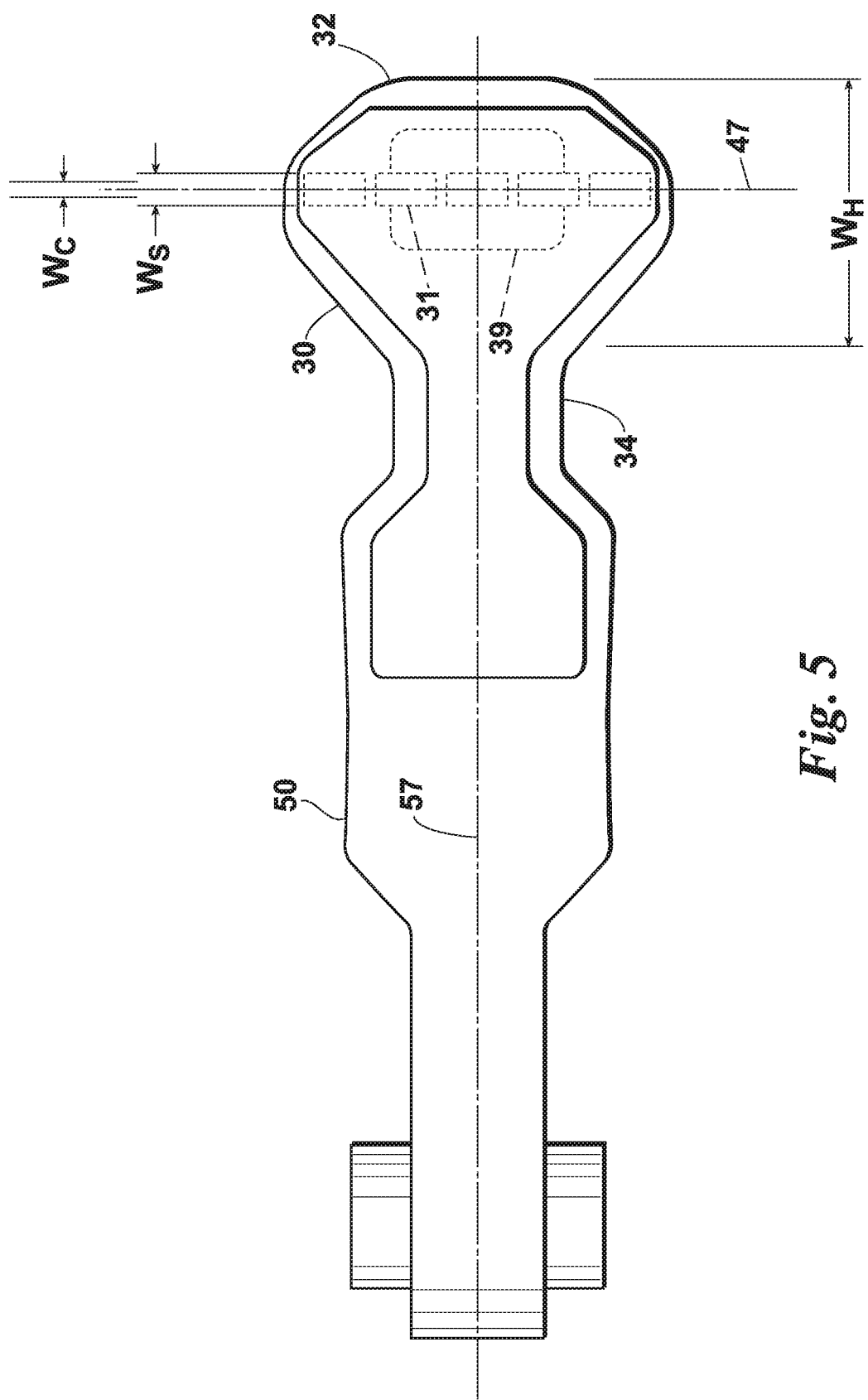
FIG. 5 is an embodiment including a row or planar array of triaxial sensing elements located in the sensor head or arm along an X-axis of the head or arm.

Embodiments of an inline inspection ("ILI") tool of this disclosure includes at least one inspection sensor module 10 that integrates a three-axis sensing element 31 contained within a sensor head 30 having a shape that more consistently tracks and maintains contact with the interior pipe wall W than prior art designs. The inspection sensor module 10 may be arranged about a cylindrical-shaped ILI tool body B of a kind known in the art and configured for use with flux leakage ILI technologies. By way of a non-limiting example, the ILI tool body B may be a T. D. Williamson, Inc. (Tulsa, Okla., USA) ILI tool body. The ILI tool body B may be connected to or integrated with other modules or pigging elements such as disks or cups known in the art to move the ILI tool body forward through the pipe by way differential pressure. FIG. 11 of U.S. Pat. No. 8,653,111 B2, incorporated by reference herein, provides an example of this type of assembly.

In embodiments of this disclosure, the continued contact is provided by a curved or arched pipe contacting portion 33 of the sensor head 30. The arched portion 33 may be surrounded by a planar portion 35, the arched portion 33 not being in a same plane as that of planar portion 35. Located below the arched portion 33 is at least one three-axis sensing element 31 connected to a sensor mount 37. The sensor mount 37 may also include circuit board 39 corresponding the sensing element 31 and having a microprocessor and associated software.

As the tool 10 traverses the pipe P, including portions of the pipe containing dents, wrinkles, weld intrusions, and other defects or anomalies, this pipe contacting portion 31 continues to track along the pipe wall W. The inspection sensor module 10 may include one or more magnetic circuits 40 configured for flux inspection of the pipe wall W. In embodiments, the circuits 40 may include a magnet and brush arrangement M like in the prior art, with the sensor head 30 located in the magnetic field between the circuits 40 and the pipe wall W. As the sensor head 30 contacts the pipe wall W along its line of travel, the magnetic field created by the circuits 40 is perturbed when the head 30 encounters a dent, wrinkle, weld intrusion, or other defect or anomaly and follows or traces along the anomaly.

In embodiments, the sensing element 31 contained within the head 30 includes at least one integrated triaxial hall effect sensor. In some embodiments, multiple triaxial hall effect sensors may be used as the sensing element 31, placed in planar array along the width $W_H$ of the sensor head 30 geometry (the X-dimension designating width of the head 30). The array of sensing elements 31 may be aligned along a common lateral axis 47 perpendicular to the central longitudinal axis 57 of the arm 50. The sensing element 31 should be positioned in close proximity to the pipe contacting portion 33 of the head 30 to maximize the response of the sensing element 31 to changes in the magnetic field between the pipe wall W and the magnetic circuit 40. In embodiments, no uniaxial sensing element or uniaxial hall effect sensor is used as part of the multiple axis data collection. Circuit board 39 may include means known in the art store the data collected by the sensor module 10, transmit the data, and analyze the data.

Figure 6:
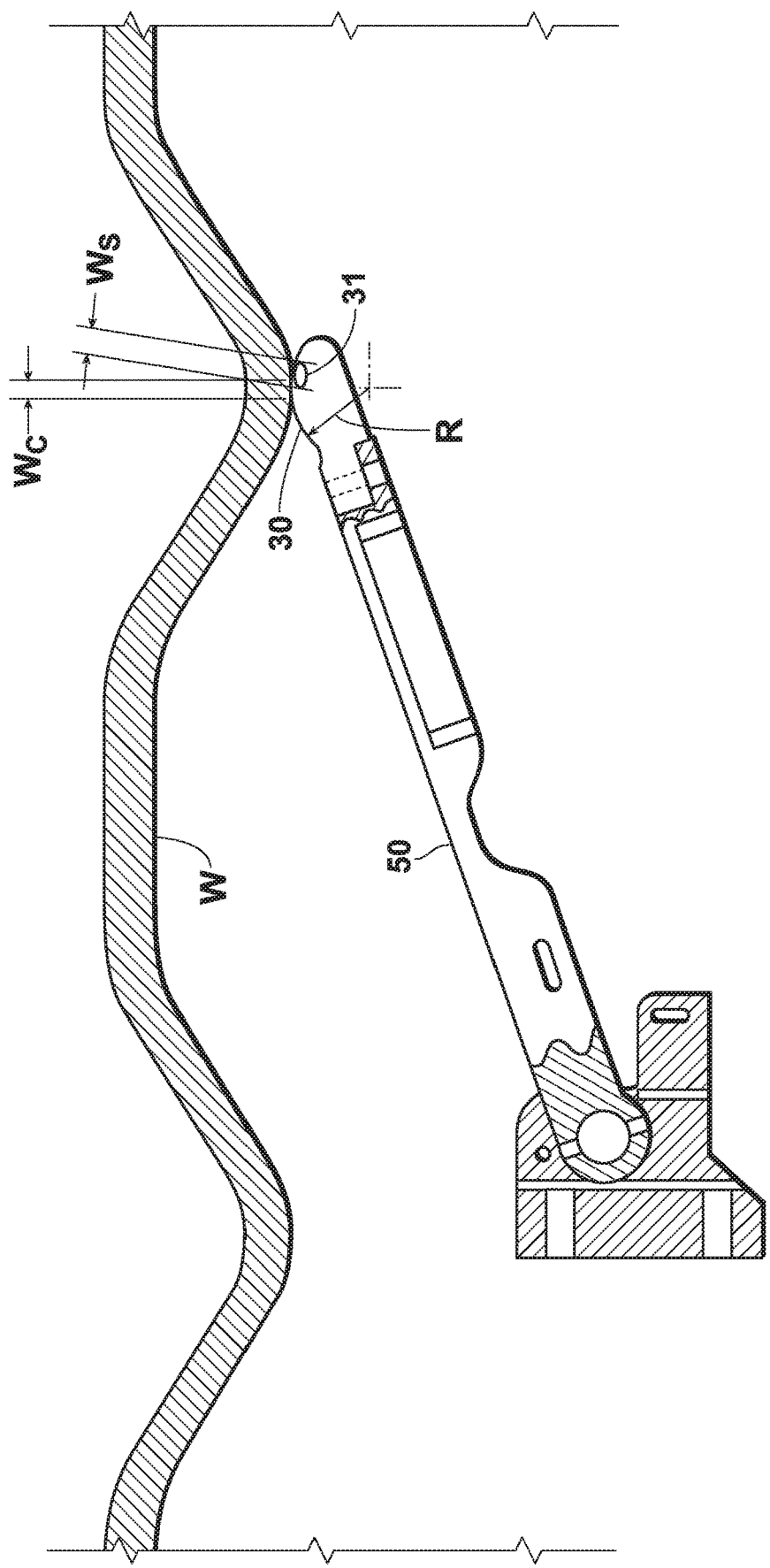
FIG. 6 is an embodiment of a sensor head of this disclosure showing a head with a pipe contacting surface profile that traces dents, wrinkles, and other deformities in the pipe surface. The sensor arm minimizes lift off as the head traces the pipe surface. The width of the pipe contacting surface is less than the width of the sensing element, the width being along the Z-axis.
Figure 7:
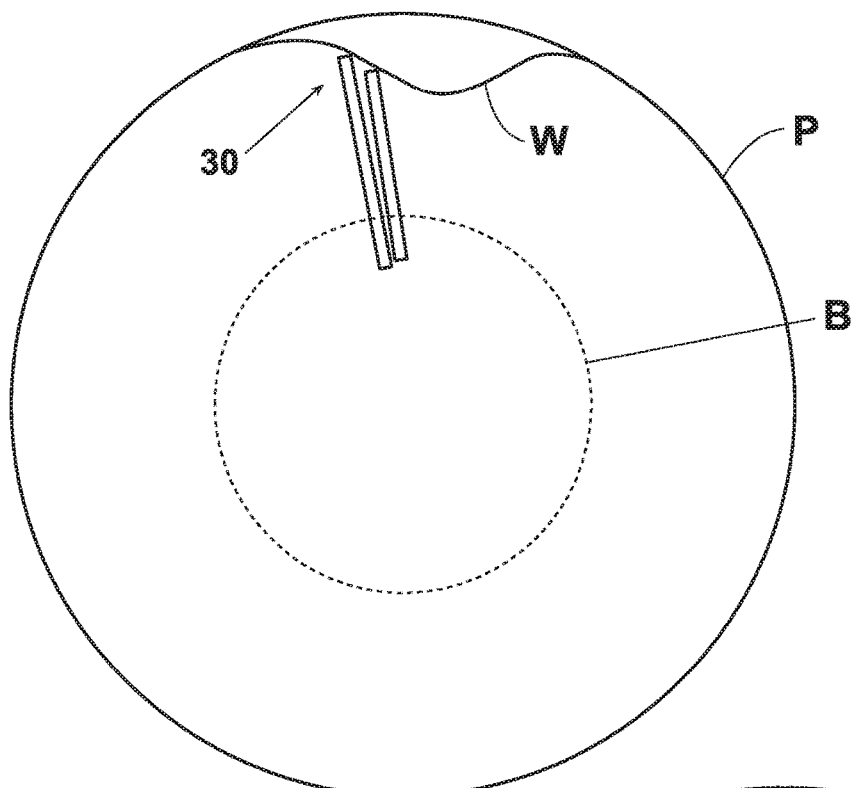
FIG. 7 is a schematic side view of the sensor head having a rounded head profile. A single sensor is located in each arm and the individual arm traces pipe geometry with optimal resolution. The magnetic circuits are not shown. A portion of the tool body is roughly indicated by the dashed lines.
Figure 8:
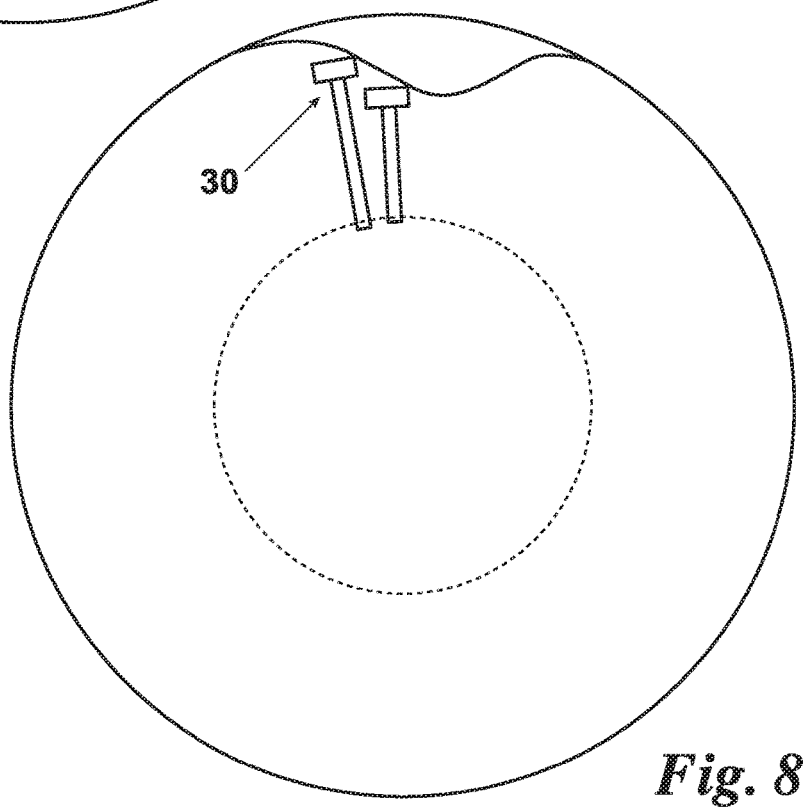
FIG. 8 is a schematic side view of another embodiment. Multiple coplanar sensors are arranged in a single arm along a Z-axis of the head. However, the head width does not track the pipe geometry as well as that of FIG. 7. Head geometry in all three dimensions impacts how well the arm tracks the pipe geometry. The integrated triaxial sensor enables optimization of head shape in all three dimensions.

Unlike the prior art, the pipe contacting portion 33 of the sensor head 30 is arcuate-, curved-, rounded-, or elliptical-shaped, at least in the Y-Z plane (using right-handed coordinates). This shape has a radius R selected so that a total width $W_C$ of the pipe wall contact area of portion 33 is less than a total width $W_S$ of the sensing element 20, $W_C$ and $W_S$ lying along the Z axis. See e.g. FIGS. 5 & 6. The pipe contacting portion 33 lies between a forward (distal) end 32 of the sensor head 30 and its rearward end 34. In embodiments, the pipe wall contact area may be many times greater than the width $W_S$ of the sensing element 20. When in use, the pipe contacting portion 31 of the head 30 traverses the pipe such that each area and subsequent area of contact between it and the pipe wall W lie along a single line of travel substantially equal to the width of the contact area $W_C$.

In some embodiments, the sensor head 30 may be mounted on an arm 50 connected to and projecting radially outward from the tool body B. The rearward end 34 may be connected to the distal end 51 of the arm. In other embodiments, the sensor head 30 may be integral to the arm 50, its forward end 32 forming a distal or nose end 51 of the arm 50. The arm 50 may be a stationary arm or a pivoting arm. In pivoting arm embodiments, the proximal end 61 of the arm 50 may be connected to a support 53 of the tool body B and include a pivot 55. The pivot 55 may be located along a central longitudinal axis 57 of the arm 50. The arm 50 may be spring loaded and include a torsion spring 59 that urges the arm outward toward the pipe wall W. connected to a pivot 53 at a proximal end 55 of the arm 50. The support 53 may be connected to or part of a backing bar. In some embodiments, the arm 50 may be a flexible arm. The arm 50 may be a straight arm. The arm 50 may formed as a loop. The arm 50 may be made of any material suitable, including but not limited to urethane. The sensor module 10 may include multiple arms 50 arrayed about the body B, each arm 50 with its own sensor head 30 and associated sensing element 31.

In embodiments of this disclosure, an ILI tool includes at least one inspection sensor module 10 having one or more sets of magnetic circuits 40 arranged about a body B of the tool; and at least one sensor arm 50 extending radially outward from the body B and including at least one triaxial sensing element 31 located toward a distal end 51 of the at least one sensor arm 50, the at least one triaxial sensing element 31 having a width $W_S$; the distal end 51 of the at least one sensor arm 50 including a pipe contacting portion 33 containing the at least one triaxial sensing element 21 and having a curve of radius R and a width $W_C$, where $W_C<W_S$.

While embodiments of an ILI tool of this disclosure have been described and example designs and features given, modifications may be made to the ILI tool and the sensor module without departing from the scope of this disclosure and the following claims. Each element recited in the claims is entitled to its full range of equivalents.

What is claimed:

1. An inline inspection tool comprising:
   at least one sensor arm (50) having a proximal end (61) and a distal end (51), the proximal end configured for connection to a body (B) of the inline inspection tool; and a sensor head (30) located at the distal end of the at least one sensor arm,
   the sensor head having a forward end (32) and a rearward end (34) and including:
      an arched-shaped pipe contacting portion (33) located between the forward and rearward ends, the arched-shaped pipe contacting portion surface having radius R and a width Wc; and
      at least one triaxial sensor element (31) having at least a portion located below the arched-shaped pipe contacting portion and having a width Ws, Wc<Ws.

2. The inline inspection tool of claim 1, further comprising
   at least one other triaxial sensor element (31) adjacent to the at least one triaxial sensor element, said triaxial sensor elements arranged along a lateral axis (47) of the sensor head.

3. The inline inspection tool of claim 1, the at least one triaxial sensor element including a triaxial hall effect sensor.

4. The inline inspection tool of claim 1, further comprising:
at least one magnetic circuit (40) corresponding to the sensor head.

5. The inline inspection tool of claim 1, further comprising:
the proximal end of the at least one support arm including a pivot (55).

6. The inline inspection tool of claim 1, further comprising:
the at least one support arm being a longitudinally extending arm.

7. The inline inspection tool of claim 1, wherein, the forward end of the sensor head and the distal end of the at least one sensor arm is a same end.

8. A method for detecting anomalies in a pipe wall, the method comprising:
passing an inline inspection tool through an interior of a pipe, the inline inspection tool including:
at least one sensor arm (50) including a proximal end (61) and a distal end (51), the proximal end configured for connection to a body (B) of the inline inspection tool, and
a sensor head (30) located at the distal end of the at least one sensor arm, the sensor head having a forward end (32) and a rearward end (34) and including:
an arched-shaped pipe contacting portion (33) located between the forward and rearward ends, the arched-shaped pipe contacting portion having a radius R and a width $W_C$; and
at least one triaxial sensor element (31) having at least a portion located below the arched-shaped pipe contacting portion and having a width $W_S$, $W_C < W_S$; and
at least one magnetic circuit (40) corresponding to the sensor head;
wherein, during the passing, contact of the sensor head with the pipe wall lies along a single line of travel equal to the width $W_C$.

9. The method of claim 8, further comprising:
collecting magnetic flux data along the single line of travel.

10. The method of claim 8, wherein, the sensor head includes at least one other triaxial sensor element (31) adjacent to the at least one triaxial sensor element, said triaxial sensor elements arranged along a lateral axis (47) of the sensor head.

11. The method of claim 8, wherein, the at least one triaxial sensor element includes a triaxial hall effect sensor.

12. The method of claim 8, wherein, the proximal end of the at least one support arm includes a pivot (55).

13. The method of claim 8, wherein, the at least one support arm is a longitudinally extending arm.

14. The method of claim 8, wherein, the forward end of the sensor head and the distal end of the at least one sensor arm is a same end.

* * * * *